(12) United States Patent
Chee-Wee et al.

(10) Patent No.: US 7,906,360 B2
(45) Date of Patent: Mar. 15, 2011

(54) MANUFACTURING PROCESS FOR A PHOTODETECTOR

(75) Inventors: Liu Chee-Wee, Taipei (TW); Lin Chu-Hsuan, Taipei (TW); Chiang Ying-Te, Taipei (TW); Hsu Chin-Chang, Taipei (TW)

(73) Assignee: National Taiwan University, Taipei (TW)

( * ) Notice: Subject to any disclaimer, the term of this patent is extended or adjusted under 35 U.S.C. 154(b) by 294 days.

(21) Appl. No.: 11/900,969

(22) Filed: Sep. 14, 2007

(65) Prior Publication Data

US 2008/0311696 A1 Dec. 18, 2008

(30) Foreign Application Priority Data

Jun. 12, 2007 (TW) ................................ 96121235 A (51) Int. Cl.
*H01L 21/00* (2006.01)

(52) U.S. Cl. ........ 438/57; 438/63; 438/73; 257/E31.001
(58) Field of Classification Search .................... 438/57, 438/63, 73, 75, 455, 459; 257/E31.001
See application file for complete search history.

(56) References Cited

U.S. PATENT DOCUMENTS

| | | | | |
|---|---|---|---|---|
| 4,122,407 A * | 10/1978 | Van Vechten | ............ | 372/45.012 |
| 5,374,564 A | 12/1994 | Bruel | ............... | 437/24 |
| 6,087,703 A * | 7/2000 | Ohta et al. | ..................... | 257/461 |
| 6,833,195 B1 | 12/2004 | Lei et al. | ........................ | 428/458 |
| 7,247,545 B2 * | 7/2007 | Maa et al. | ...................... | 438/455 |
| 2006/0019466 A1 * | 1/2006 | Nayfeh et al. | ................ | 438/458 |

FOREIGN PATENT DOCUMENTS

TW 414930 6/1989

OTHER PUBLICATIONS

C.-Y. Yu et al. "Low-temperature fabrication and characterization of Ge-on-insulator structures", Applied Physics Letters, 89, 101913 (2006), pp. 101913-1 through 101913-3.
B.-C. Hsu et al., "MOS Ge/Si quantum Dot Infrared Photodetectors with Quantum Dot and Wetting Layer Responses", ISDRS, 2003, 2 pgs.

* cited by examiner

*Primary Examiner* — Michael Trinh
(74) *Attorney, Agent, or Firm* — Haverstock & Owens LLP (57) ABSTRACT

A manufacturing process for a photo-detector is provided. The present manufacturing process for a photo-detector comprises the steps of: (a) providing a thin-film Ge on a cheap substrate including a first processing area and a second processing area; (b) performing a defect-reduction processing to at least one of the first processing area and the second processing area; and (c) forming a photo-detector element on the Ge.

10 Claims, 6 Drawing Sheets

MANUFACTURING PROCESS FOR A PHOTODETECTOR

FIELD OF THE INVENTION

The present invention relates to a manufacturing process for a photo-detector, and more particularly to a manufacturing process for a photo-detector with a metal-insulator-semiconductor structure, a P-type-intrinsic-N-type structure or a metal-semiconductor-metal structure formed on a carrier substrate having a germanium layer.

BACKGROUND OF THE INVENTION

Taiwan Patent No. 414930 taught that a MOS tunneling diode has been used in the photo-detector, but the detectable wavelength is restrained to the energy gap of the semiconductor material since the additional pairs of electrons and electrical holes are only produced when the energy of photons is higher than the energy gap of material. If a Si substrate is used, the cutoff wavelength thereof is 1.1 μm; and if a Ge substrate is used, the cutoff wavelength thereof is 1.85 μm. Therefore, the Ge material is preferable if 1.3~1.55 μm of the photo-detection is desired. However, the application of a whole piece of Ge as substrates is highly expensive.

In addition, U.S. Pat. No. 5,374,564 disclosed a smart-cut process, which utilizes a hydrogen implanting technique to implant the hydrogen ions into the inner layers of the wafer, wherein the implanted depth is controlled by the implanting energy. Then, cut the wafer by means of the cleft characteristic of the implanted hydrogen ions being processed during high temperature. This kind of technique can cut the expensive and whole piece of Ge substrate into a plurality of thin Ge wafers.

Furthermore, in U.S. Pat. No. 6,833,195B1, Intel Corp. first implanted ions into the Ge substrates and activates the surfaces of the Ge and Si substrates, followed by bonding the Ge substrate and the Si substrate. As disclosed in the previous smart-cut process, a Si substrate including a thin Ge layer thereon is obtained.

In Applied Physics Letters 89, 101913 (2006), entitled "Low-temperature fabrication and characterization of Ge-on-insulator structures", a kind of photo-detector is disclosed. The aim of the invention is to provide a photo-detector structure with a metal-insulator-semiconductor formed on a carrier substrate having a Ge layer and a manufacturing process thereof to lower down the expensive cost of using the Ge material. The above invention provides a photo-detector comprising a carrier substrate, a Ge layer, a first metal electrode, an insulating layer and a second metal electrode. The Ge layer is formed on the carrier substrate and includes a first area and a second area. The first metal electrode is formed on the first area, the insulating layer is formed on the second area, and the second metal electrode is formed on the insulating layer which is formed by means of a low temperature liquid phase deposit technique. Despite the invention utilizes the cheaper $SiO_2$—Si substrate rather than the rare and expensive Ge material, there still exists a problem with a higher amount of dark current. In addition, further cheaper substrates, like glass are more desirable.

Moreover, ISDRS (International Semiconductor Device Research Symposium, 2003) published a paper entitled "MOS Ge/Si Quantum Dot Infrared Photodetectors with Quantum Dot and wetting Layer Responses" where the light currents are also reduced while the problem of the dark currents is improved by of the disclosed methods.

From the above description, it is known that how to provide a photo-detector capable of simultaneously enhancing the light current and reducing the dark current has become a major problem waited to be solved. In order to overcome the drawbacks in the prior art, a manufacturing process for a photo-detector is provided. The particular design in the present invention not only solves the problems described above, but also is easy to be implemented. Thus, the invention has the utility for the industry.

SUMMARY OF THE INVENTION

In accordance with one aspect of the present invention, a manufacturing process for a photo-detector is provided to solve the current problem of the higher amount of dark current existing in the photo-detector formed on the carrier substrate having a Ge layer.

The present manufacturing process for a photo-detector comprises the following steps: (a) providing a thin-film Ge on a cheap substrate including a first processing area and a second processing area; (b) defect-reduction processing at least one of the first processing area and the second processing area; and (c) forming a photo-detector element on the Ge.

Preferably, the present invention could simultaneously raise the light current and lower down the dark current.

Moreover, the present invention could perform a defect-reduction processing to one of the first processing area and the second processing area, and thus the preferable light response of the visible light and the invisible light. Multi-wavelength photo-detection can be also achieved on the same chip.

The above aspects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Please refer to FIGS. 1(a)~(g), which show section diagrams of the photo-detector according to a first preferable embodiment of the present invention.

Figure 1A:
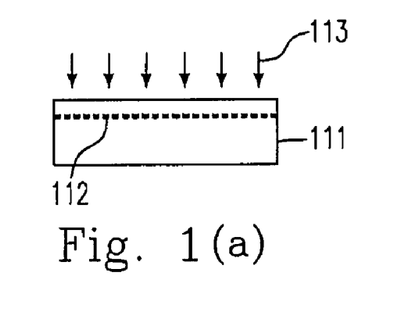
FIGS. 1(a)~(g) are section diagrams of the photo-detector according to a first preferable embodiment of the present invention.

Please refer to FIG. 1(a), the smart-cut process taught by U.S. Pat. No. 5,374,564 is adopted in the present invention. By means of the ion implanting technique, implant hydrogen ions 113 into an interface 112 of an N-type Ge substrate 111 under the condition of the energy 150 keV and the implanting quantity 1.5E17 ($cm^{-2}$), wherein the implanting depth is related to the implanting energy and the implanting concentration is related to the processing temperature and period of the split wafer.

Figures 1B, 1C, 1D, 1F, 1G:
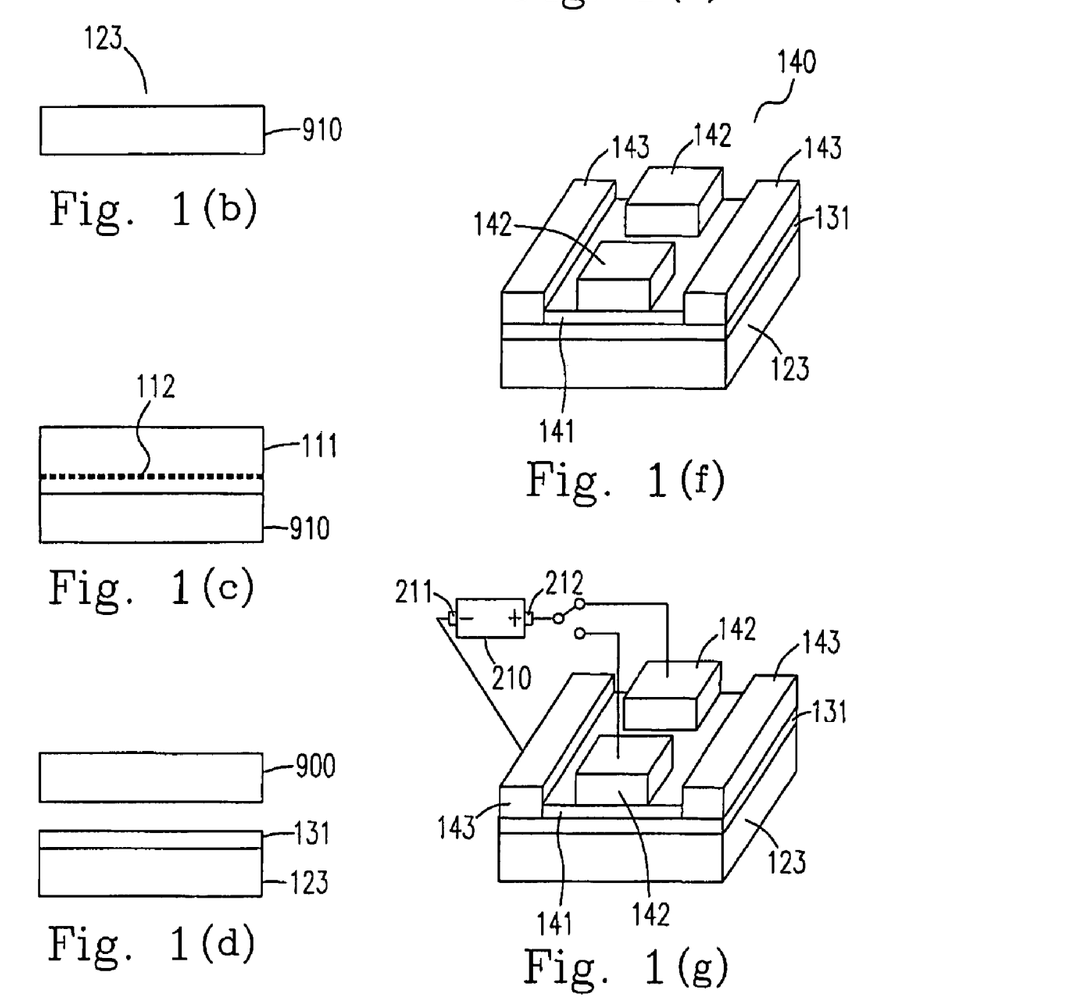

Please refer to FIG. 1(b), which shows a glass substrate 910 provided as a carrier substrate 123.

Then, the technique taught by U.S. Pat. No. 6,833,195B1 will be used in the following steps of the preferable embodiments of the present invention.

Sonicate the Ge substrate 111 and the glass substrate 910 with deionized water for 5 mins to remove the powder existing on the surface of the wafer. Immerse the glass substrate 910 in Standard Clean 1 (SC-1, $NH_4OH:H_2O_2:H_2O$~0.5:1:5) at 80° C. for 15 mins and immerse the Ge substrate 111 in potassium hydroxide-deionized and purified water (KOH: $H_2O$~1:5) at 80° C. for 15 mins. Then, wash the respective Ge substrate 111 and the glass substrate 910 with deionized water for 5 mins, followed by performing a blowing therefor with high pressure and pure nitrogen gas, where the surface thereof become the hydrophilic surfaces filled with $OH^-$ bonding.

Please refer to FIG. 1(c), line up the bonding interface of the respective Ge substrate 111 and the glass substrate 910 and then directly bond the wafers at room temperature in the clean room. In other embodiments, the bonding of the wafers could be assisted by a viscous layer.

Please refer to FIG. 1(d), place the bonded Ge substrate 111 and the glass substrate 910 in a purge environment under the atmosphere, followed by raising the temperature to 150° C. for 6 hours to enhance the strength of the wafer bonding. Then, raise the temperature to 200° C. for 40 mins to produce a wafer separation in the interface 112 that hydrogen ions implanted. The separated carrier substrate 123 includes a thin Ge layer 131 that has been successfully transferred and the separated Ge substrate 111 becomes a remaining Ge substrate 900 thinner than the original Ge substrate 111.

In other embodiments, the Ge substrate 111 and the glass substrate 910 could be separated by heating for a period ranged from couple minutes to couple hours at a temperature ranged from 100° C. to 600° C.

Figure 1E:
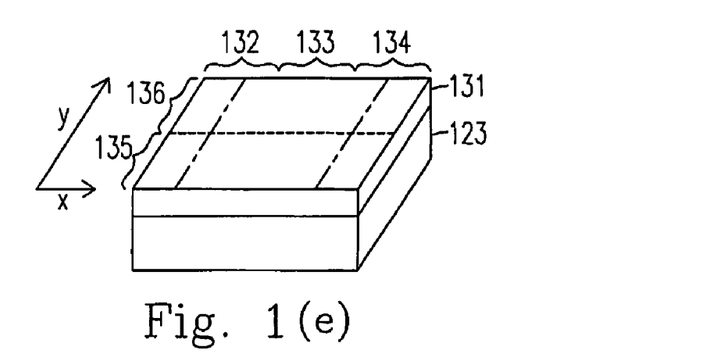

Please refer to FIG. 1(e). The Ge layer 131 could be divided into a first area 132, a second area 133 and a third area 134 along the x-axis direction. Besides, the Ge layer 131 could be divided into a first processing area 135 and a second processing area 136 along the y-axis direction. Then, perform a defect-reduction processing to the first processing area 135 to reduce the surface defect thereof. In the embodiment, the surface defect of the first processing area 135 of the Ge layer 131 is processed by a SC-1 etching among the wet etching methods. In other embodiments the defect-reduction processing could be performed by other kinds of common wet etching methods or one of the following methods including a dry etching, a chemical mechanical polishing and a low-defect Ge layer re-growth.

In addition, only the first processing area 135 is processed to reduce the defect in the embodiment. However, the whole surface of the Ge layer could be processed to reduce both of the surface of the first and second processing area 135 and 136 in other embodiments. Next, dispose a photo-detector element onto the first processing area 135 and dispose another photo-detector element onto the second processing area 136. In the first preferred embodiment, both of the photo-detectors formed on the Ge layer 131 are metal-insulator-semiconductor (MIS) elements and in other embodiments both of the photo-detectors could be P-type-intrinsic type-N-type (PIN) elements or metal-semiconductor-metal (MSM) elements. In addition to the mentioned photo-detector elements, any kinds of photo-detector elements could be formed on the Ge layer 131 for those skilled in the art.

Please refer to FIG. 1(f). To form the MIS element of the first preferred embodiment on the Ge layer 131, deposit the insulating layer 141 of 1.6 nm silicon dioxide as a tunneling gate insulator by means of a low temperature liquid phase deposition technique. Then, form a second metal electrode 142 on the insulating layer 141 by means of lithography, remove the insulating layer 141 on the first area 132 and the third area 134 by means of lithography and an etching technique, followed by forming a first metal electrode 143 on the mentioned removed area by coating aluminum thereon as an ohm contact point to form a photo-detector 140 of the present embodiment. Furthermore, the prior MIS photo-detector has different kinds of MIS structures and thus any kinds of MIS photo-detectors can be formed on the Ge layer 131 by a defect-reduction processing for those skilled in the art.

In the embodiment, the insulating layer 141 is formed through a low temperature liquid phase deposition technique. However, in other embodiments the present insulating layer 141 could be formed through a chemical vapor deposition or a physical vapor deposition.

Moreover, in this embodiment the insulating layer 141 is made of silicon dioxide. However, in other embodiments the insulating layer 141 could be made of high-dielectric materials.

Please refer to FIG. 1(g). A power voltage 210 is provided. The power source 210 comprises a first electrode 211 and a second electrode 212. The first electrode 211 is connected to the first metal electrode 143 and the second electrode is a switching circuit and connected to the second metal electrode 142 so that the second electrode 212 is optionally switched into connecting the second metal electrode 142 disposed on the first processing area 135 or into connecting the second metal electrode 142 disposed on the second processing area 136. Further, the power source 210 provides a bias to generate a quantum tunneling effect so that the photo-detector 140 generates a photo-current upon being illuminated.

Figure 2:
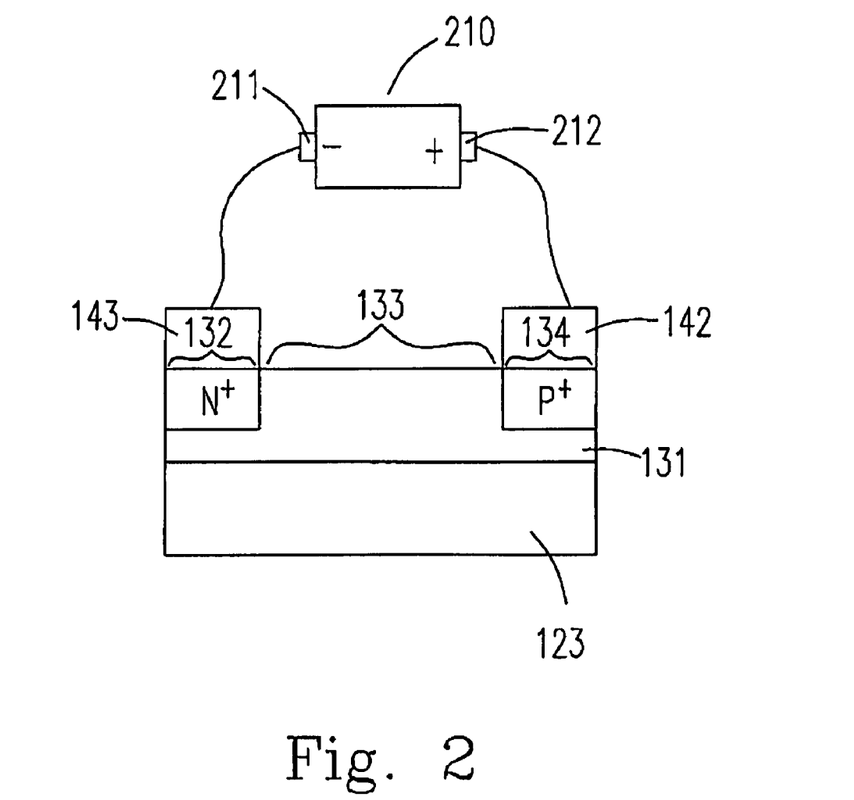
FIG. 2 is a section diagram of the photo-detector according to a second preferred embodiment of the present invention.

Please refer to FIG. 2, which shows a section diagram of the photo-detector according to a second preferred embodiment of the present invention. After finishing the defect-reduction processing to the Ge layer 131 (as illustrated in FIG. 1(e)), perform an ion implantation and bombard arsenic ions ($As^+$) into the first area 132 to form an N-type contact, followed by performing an ion implantation and bombarding boron ions ($B^-$) into the third area 134 to form a P-type contact. Then, dispose the first metal electrode 143 onto the first area 132 and dispose the second metal electrode 142 onto the third area 134 to form the P-type-intrinsic-N-type (PIN) photo-detector element of the second preferred embodiment. Furthermore, the prior PIN photo-detector has different kinds of PIN structures and thus any kinds of PIN photo-detectors can be formed on the Ge layer 131 by a defect-reduction processing for those skilled in the art.

Figure 3:
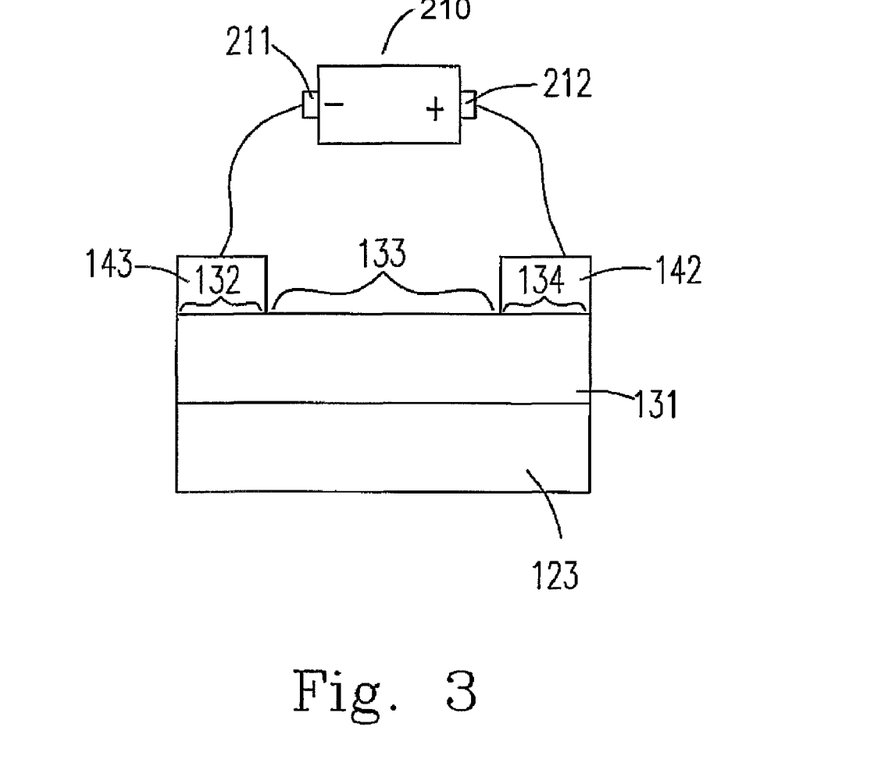
FIG. 3 is a section diagram of the photo-detector according a third preferred embodiment of the present invention.

Please refer to FIG. 3, which shows a section of the photo-detector according a third preferred embodiment of the present invention. After finishing the defect-reduction processing on the Ge layer 131 (as illustrated in FIG. 1(e)), dispose the first metal electrode 143 onto the first area 132 and dispose the second metal electrode 142 onto the third area 134 so that the metal-semiconductor-metal (MSM) photo-detector element of the third preferred embodiment is formed. Furthermore, the prior MSM photo-detector has different kinds of MSM structures and thus any kinds of PIN photo-detectors can be formed on the Ge layer 131 by a defect-reduction processing for those skilled in the art.

Figure 4A:
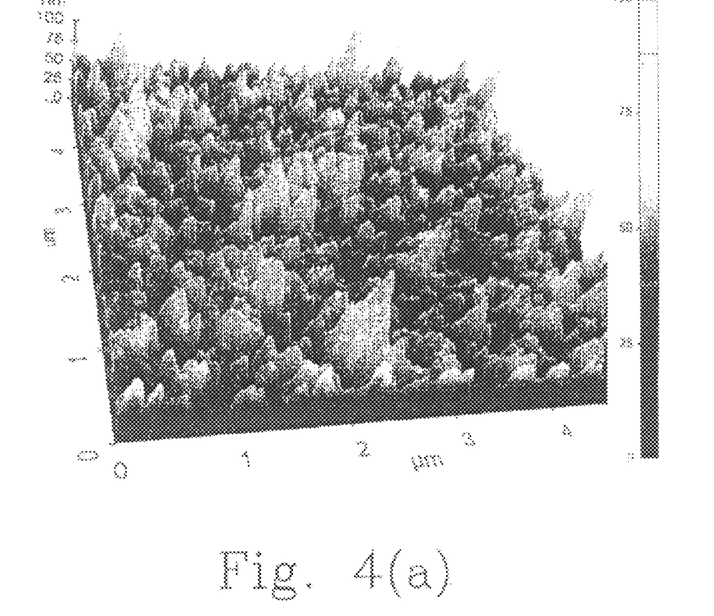
FIGS. 4(a)~(b) are atomic force microscopy diagrams of the photo-detector processed with and without a SC-1 etching according to a first preferred embodiment of the present invention.
Figure 4B:
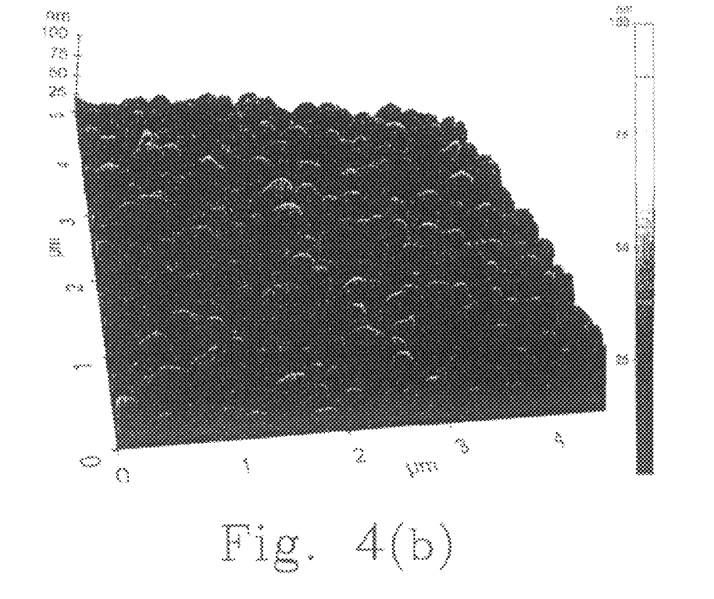

Please refer to FIGS. 4(a)~(b), which show atomic force microscope diagrams of the photo-detector processed with and without a SC-1 etching according to a first preferred embodiment of the present invention.

Please refer to FIG. 4(a), which shows an atomic force microscope diagram of the second processing area 136 of the Ge layer 131 without a SC-1 etching.

Please refer to FIG. 4(b), which shows an atomic force microscope diagram of the first processing area 135 of the Ge layer 131 processed with a SC-1 etching. As compared FIG. 4(a) and FIG. 4(b), it is known that the etched Ge layer 131 has a lower surface roughness.

Figure 5:
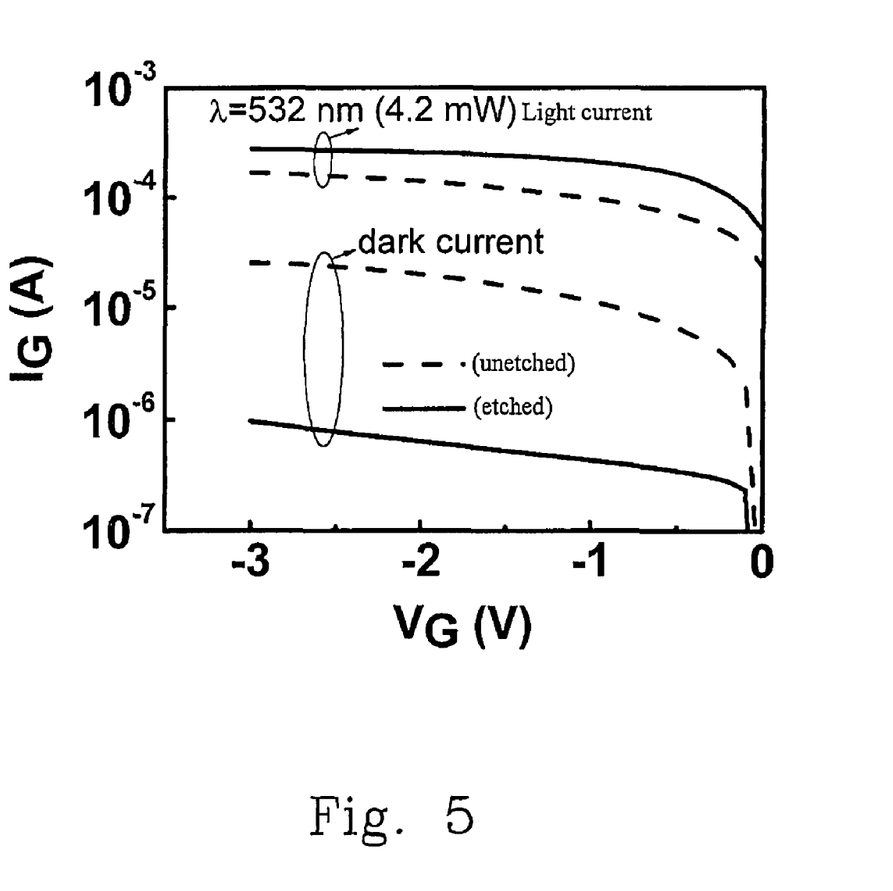
FIG. 5 is a variation diagram of the dark current and green light current versus the voltage of the insulator of the Ge layer 131 before and after etched.

Please refer to FIG. 5, which shows a variation diagram of the dark current and green light current versus the voltage of the photo-detectors with and without etching. It is known from the result of FIG. 5 that the dark current after etched is highly reduced, whereas the green light current, whose wavelength is 532 nm, after etched is increased.

Figure 6:
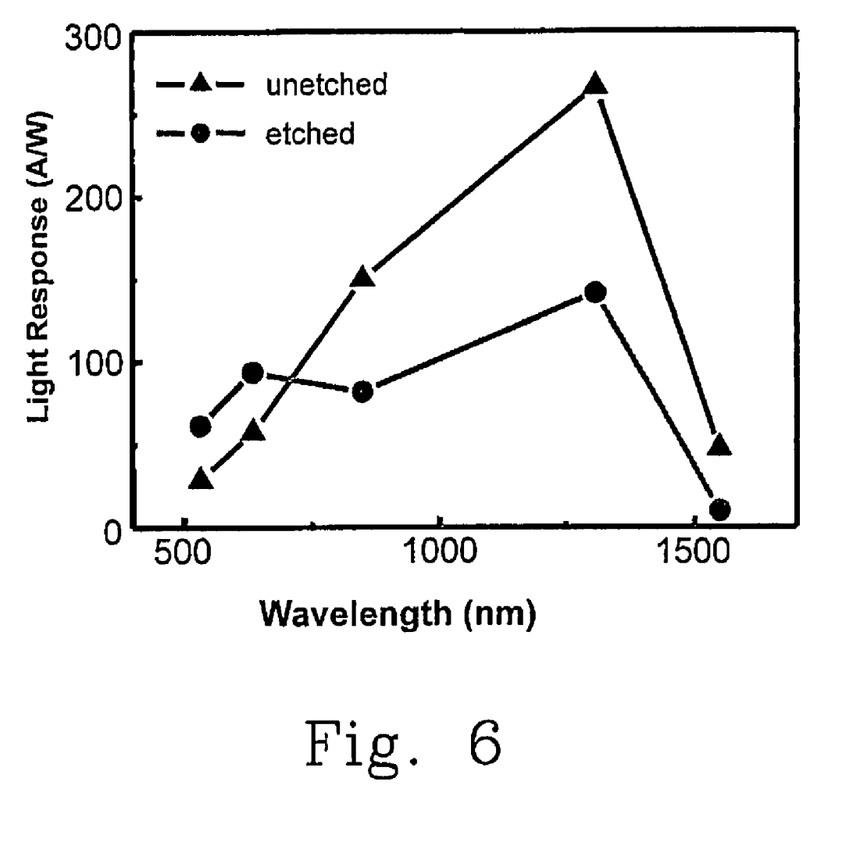
FIG. 6 is a variation diagram of the wavelength versus the light response of the photo-detectors with and without etching.

Please refer to FIG. 6, which shows a variation diagram of the wavelength versus the light response of the photo-detectors with and without etching. It is known that the light response being etched at the visible wavelength is increased. In addition, the light response being etched at the invisible wavelength turns out to be reduced.

Therefore, in the first preferred embodiment only parts of the Ge layer 131 is processed with a SC-1 etching. That is, only the first processing area 135 is processed with a SC-1 etching, which removes the defects formed during the smart-cut process and reduces the surface peaks of the Ge layer so that the response of the visible light can be highly enhanced since the probability of the recombination of the electron hole pairs can be reduced regarding the visible light with a less absorbing depth. In addition, the second processing area 136 retains a higher response of the infrared light due to a deeper active area since it does not process with a SC-1 etching. Therefore, in the first preferred embodiment only the first processing area 135 is processed with an etching and the photo-detector is selected from one disposed onto the first processing area 135 and the second processing area 136 by means of the second metal electrode 212 so as to achieve the multi-wavelength photo-detection.

Figure 7:
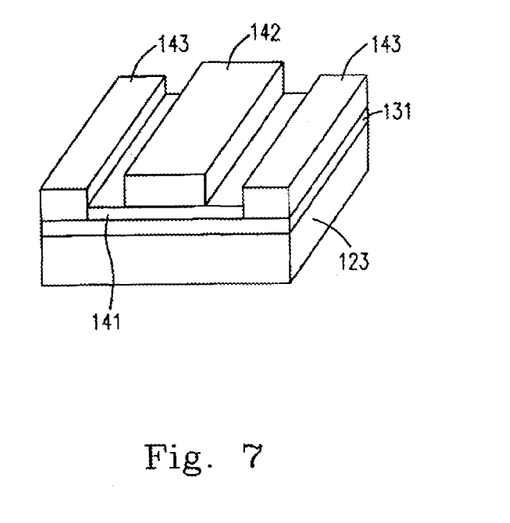
FIG. 7 is a diagram of the photo-detector where the first processing area and the second processing area are etched according to a fourth preferred embodiment of the present invention.

Please refer to FIG. 7, which shows a diagram of the photo-detector where the first processing area and the second processing area are etched according to a fourth embodiment of the present invention. In the fourth preferred embodiment, the first processing area 135 and the second processing area 136 are both processed with a SC-1 etching to obtain a less dark current and acquire a better light current. After an etching process, form the insulating layer 141, the second metal electrode 142 and the metal electrode 143 to form the MIS photo-detection element. The difference between the first embodiment and the fourth embodiment lies in the fourth embodiment has only one second metal electrode 142 rather than two of the first embodiment.

Furthermore, in the other embodiments PIN, MSM or other kinds of photo-detector elements can be disposed onto the Ge layer where the first processing area 135 and the second processing area 136 are processed with a SC-1 etching so that a smaller dark current is obtained and a better light current is also obtained.

In the present embodiments, the carrier substrate 123 can be a glass substrate, a Si wafer with silicon dioxide, a plastic substrate or other kinds of substrates capable of transferring thin Ge layer.

In the present embodiments, the Ge layer 131 is cleaved by n-type Ge substrate 111. However, the Ge layer 131 can be cleaved by P-type or undoping substrate 111, wherein the doping concentration can be adjusted depending on the necessity. The Ge substrate 111 can be deemed as a mono-crystalline substrate, a poly-crystalline substrate or a non-crystalline substrate and can be a [100] substrate, a [110] substrate or a [111] substrate.

In the present embodiments, the first and second metal electrodes 143 and 142 are made of aluminum and it can also be made of any metals.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing process for a photo-detector, comprising:
    (a) providing a germanium substrate with a plane including a first processing area and a second processing area which are both on the plane;
    (b) defect-reduction processing only one of the first processing area and the second processing area; and
    (c) forming metal-insulator-semiconductor photo-detector elements on the germanium substrate to achieve a multi-wavelength photo-detection on a single chip.

2. A manufacturing process as claimed in claim 1, wherein the metal-insulator-semiconductor photo-detector element comprises a first metal electrode and a second metal electrode and the manufacturing process further comprises a step of:
    providing a bias through a power source including a first electrode and a second electrode, wherein the first electrode is connected to the first metal electrode and the second electrode is connected to the second metal electrode for generating a quantum tunneling effect, so that the photo-detector generates a light current upon being illuminated.

3. A manufacturing process as claimed in claim 2, further comprising steps of:
    forming two metal-insulator-semiconductor photo-detector elements on the germanium substrate; and
    switching the second electrode into connecting one of the two second metal electrodes.

4. A manufacturing process as claimed in claim 1, wherein the step (a) further comprises steps of:
    (a1) implanting hydrogen ions into the germanium substrate to form an implanting layer;
    (a2) providing a carrier substrate and bonding the germanium substrate thereto; and
    (a3) heating the germanium substrate at a temperature ranged from 100° C.~600° C., wherein the carrier substrate is a glass substrate.

5. A manufacturing process as claimed in claim 4, wherein the germanium substrate is one selected from a group consisting of a mono-crystalline germanium substrate, a poly-crystalline germanium substrate, a non-crystalline germanium substrate, a non-doping germanium substrate, a P-type doping germanium substrate and an N-type doping germanium substrate.

6. A manufacturing process as claimed in claim 4, wherein the germanium substrate is one selected from a group consisting of a [100] germanium substrate, a [110] germanium substrate and a [111] germanium substrate.

7. A manufacturing process as claimed in claim 4, wherein the step (a2) further comprises steps of:
providing a Si substrate; and
forming an insulating layer onto the Si substrate to form the carrier substrate.

8. A manufacturing process as claimed in claim 1, wherein the defect-reduction processing step (b) is performed by one a dry etching and a wet etching.

9. A manufacturing process as claimed in claim 2, wherein the germanium substrate comprises a first area, a second area and a third area and the manufacturing process further comprises steps of:
(c11) forming an insulating layer on the first, the second and the third areas;
(c12) forming the second metal electrode on the insulating layer above the second area;
(c13) removing the insulating layer on the first and third areas; and
(c14) forming the first metal electrode on the first and third areas.

10. A manufacturing process as claimed in claim 9, wherein the insulating layer in the step (c11) is formed by one selected from a group consisting of a low temperature liquid phase deposition, a chemical vapor deposition, a physical vapor deposition, a silicon dioxide deposition and a high-dielectric material deposition.

* * * * *

UNITED STATES PATENT AND TRADEMARK OFFICE
CERTIFICATE OF CORRECTION

PATENT NO. : 7,906,360 B2  Page 1 of 1
APPLICATION NO. : 11/900969
DATED : March 15, 2011
INVENTOR(S) : Liu Chee-Wee et al.

It is certified that error appears in the above-identified patent and that said Letters Patent is hereby corrected as shown below:

<u>IN THE DRAWINGS</u>

Delete Figure 7, and replace Figure 7 as shown below.

Fig. 7

Signed and Sealed this
Seventeenth Day of May, 2011

David J. Kappos
*Director of the United States Patent and Trademark Office*